United States Patent [19]

Maeda et al.

[11] Patent Number: 4,561,486
[45] Date of Patent: Dec. 31, 1985

[54] METHOD FOR FABRICATING POLYCRYSTALLINE SILICON WAFER

[75] Inventors: Yasuhiro Maeda; Takashi Yokoyama; Shinichi Yagihashi, all of Sapporo, Japan

[73] Assignee: Hoxan Corporation, Sapporo, Japan

[21] Appl. No.: 373,039

[22] Filed: Apr. 29, 1982

[30] Foreign Application Priority Data

| Apr. 30, 1981 | [JP] | Japan | 56-66021 |
| Nov. 18, 1981 | [JP] | Japan | 56-184812 |
| Mar. 23, 1982 | [JP] | Japan | 57-46068 |
| Mar. 23, 1982 | [JP] | Japan | 57-46069 |
| Mar. 23, 1982 | [JP] | Japan | 57-46070 |
| Mar. 23, 1982 | [JP] | Japan | 57-40728[U] |
| Mar. 29, 1982 | [JP] | Japan | 57-50543 |

[51] Int. Cl.$^4$ ............................................. B22D 13/00
[52] U.S. Cl. ........................... 164/118; 156/DIG. 64; 156/616 R; 136/261; 427/240
[58] Field of Search .............. 156/622, 624, DIG. 88, 156/DIG. 64, DIG. 89, DIG. 83; 427/93, 94, 86, 240, 241; 164/114, 118, 285, 286, 122.1, 122.2; 423/348, 349; 136/258, 261

[56] References Cited

U.S. PATENT DOCUMENTS

| 3,713,883 | 1/1973 | Lien | 156/622 |
| 4,099,924 | 7/1978 | Berkman et al. | 156/DIG. 83 |
| 4,124,411 | 11/1978 | Meuleman et al. | 136/897 F |
| 4,131,659 | 12/1978 | Authier et al. | 423/348 |
| 4,211,821 | 7/1980 | Hadni | 156/622 |
| 4,229,231 | 10/1980 | Witt et al. | 148/1.5 |
| 4,240,494 | 12/1980 | Kryanin et al. | 164/114 |
| 4,267,212 | 5/1981 | Sakawaki | 427/240 |
| 4,357,200 | 11/1982 | Grabmaier | 156/DIG. 88 |

FOREIGN PATENT DOCUMENTS 0122682 9/1979 Japan ............................ 156/DIG. 83

OTHER PUBLICATIONS

Crystals, J. Dictl et al., V5 Silicon Springer-Verlag 1981.

*Primary Examiner*—Hiram H. Bernstein
*Attorney, Agent, or Firm*—George B. Oujevolk

[57] ABSTRACT

A method of fabricating a polycrystalline silicon wafer, which method includes the steps of radially outwardly flowing molten liquid of silicon base material on the wafer forming surface of a turntable mechanism by means of centrifugal force, thereby forming a thin molten liquid layer in a prescribed atmosphere, and cooling and solidifying the same. An apparatus for fabricating the wafer is used to carry out the method with a recover tray arranged at the wafer forming surface for receiving the excessive silicon liquid scattered, and a wafer tray placed on the recovery tray. The wafer forming surface is cooled with coolant flowing in the wafer forming mechanism. Thus, large crystalline grains can be grown on the wafer in free states with the atmosphere from the inner surfaces of the casting mold.

1 Claim, 23 Drawing Figures

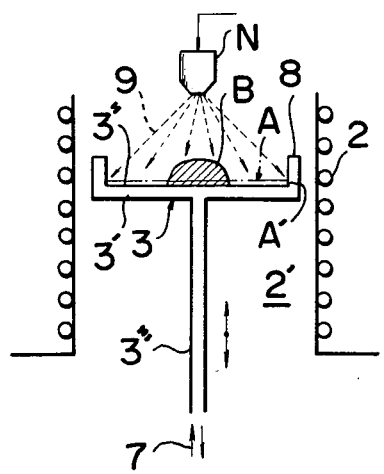
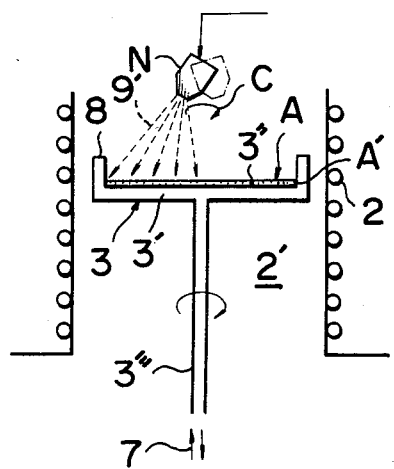
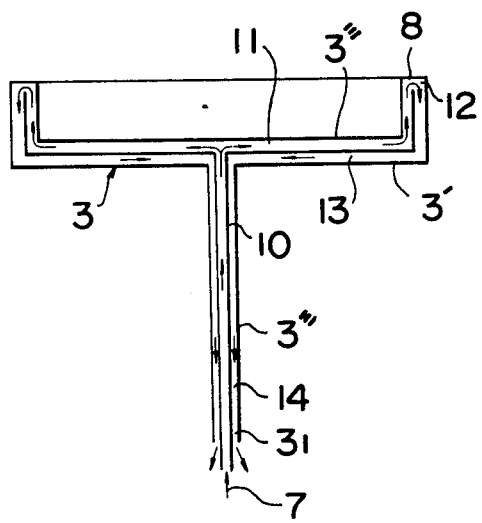
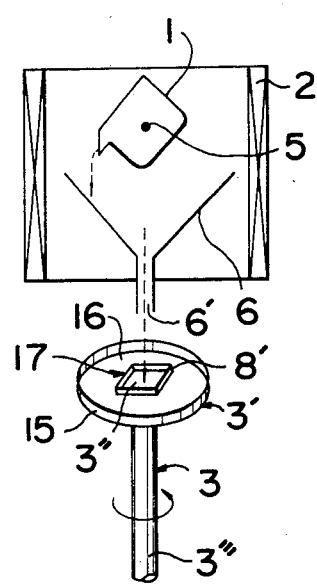

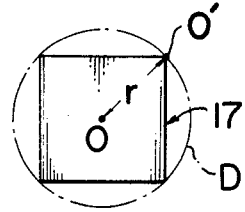
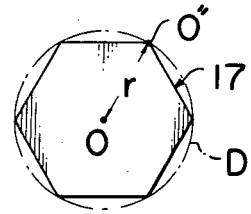
FIG. 8a  FIG. 8b
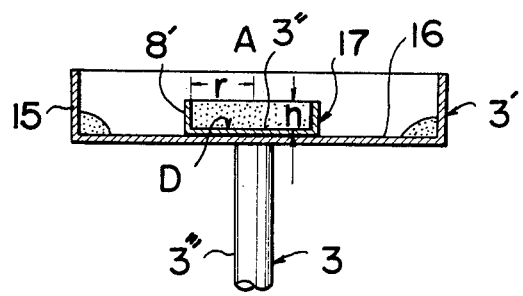
FIG. 9
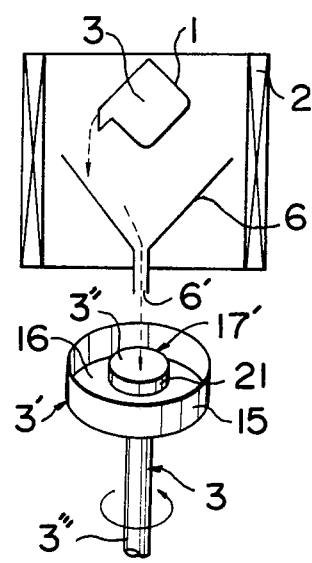
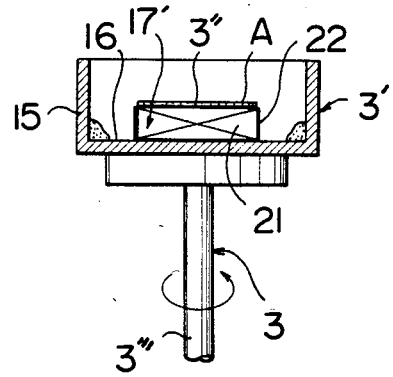
FIG. 10  FIG. 11

METHOD FOR FABRICATING POLYCRYSTALLINE SILICON WAFER

BACKGROUND OF THE INVENTION

This invention relates to a method of fabricating a polycrystalline silicon wafer used for a solar battery, a photoelectric converter, etc.

A polycrystalline silicon wafer was heretofore fabricated by a variety of methods. Generally, an ingot of prescribed shape is temporarily cast from a silicon base material, and is then sliced to fabricate a wafer. Since this conventional method takes a long time to slice the ingot and yet approx. 50% of the ingot is wasted at the time of slicing the ingot, the product of the wafer becomes expensive, and it is further impossible to fabricate a number of wafers in a mass production.

A ribbon method and a casting method are already executed as a method without slicing step for that purpose. The ribbon method has, for example, the steps of injecting molten silicon to the peripheral surface of a rotating drum and forming a ribbon-shaped wafer on the peripheral surface of the drum. According to this ribbon method, a ribbon having only a width of several millimeters can be fabricated, and it has the disadvantage that a solar battery cell of large size cannot be fabricated.

The casting method has the steps of heating a silicon base material into its molten liquid, pouring the molten silicon material in a mold prepared in response to the size of the wafer of the product, and further press molding the molten material by the movable mold to solidify the molten material. According to this casting method, the wafer of prescribed shape can be obtained simultaneously and a good result can be expected from the standpoint of its mass production, but the molten silicon base material flows from all the peripheral directions.

Thus, the growth of silicon crystalline grains is disadvantageously suppressed according to this casting method when the molten silicon material is solidified along the upper, lower and side surfaces of the casting mold. This causes the vicinity of the parts of the silicon material to be solidified in contact with the upper, lower and side surfaces of the mold to become extremely fine crystalline grains, but cannot obtain large crystalline grains. This does not satisfy the requirements of the production of large crystalline grains which are desired for a silicon wafer used for a solar battery cell. Accordingly, the photoelectric conversion efficiency of the solar battery thus obtained with the wafer is badly deteriorated to 2 to 3% as its drawbacks and disadvantages.

SUMMARY AND OBJECTS OF THE INVENTION

Briefly stated, this invention provides a method of fabricating a polycrystalline silicon wafer which can form large crystalline grains in the polycrystalline wafer of desired size in mass production without loss of the silicon base material with a simple arrangement by radially flowing the molten liquid of the silicon base material on the wafer forming surface of a turntable mechanism by means of the centrifugal force produced by the rotating of the mechanism and thus forming a thin molten liquid layer of desired size with the molten liquid as well as cooling and solidifying the liquid.

Also, this invention provides a method of fabricating a polycrystalline silicon wafer which can simply obtain the polycrystalline silicon wafers of a variety of desired shapes in addition to the foregoing objective by forming a molten liquid thin layer of silicon base material in a desired shape defined at the rising peripheral edge located at the outer periphery of the wafer forming surface of a turntable mechanism, cooling the layer and solidifying the layer when forming the layer with the molten liquid by radially flowing the molten liquid on the wafer forming surface by means of the centrifugal force produced by the rotating of the mechanism.

Yet another object of this invention is to provide a method of fabricating a polycrystalline silicon wafer which can suppress the mixture of an impurity in the wafer of the product and can also improve the productivity by not only radially flowing the silicon base material by means of the centrifugal force but also radially flowing the silicon material by means of gas injection from a nozzle, thereby shortening the time required to convert molten liquid state of the silicon base material to solidified state.

The invention also contemplates providing a method of producing a polycrystalline silicon wafer of desired shape, e.g., a square shape and of desired thickness by externally causing the overflow of molten liquid silicon base material which is in excess over the rising peripheral edge located at the outer periphery of the wafer forming surface when radially flowing the liquid by the centrifugal force as described, cooling and solidifying the thin molten liquid layer thus obtained, then filling the space defined by the wafer forming surface and the rising peripheral edge with the supplied molten liquid to form a thin molten liquid layer as well as to eliminate the drawbacks of decreasing the rate of solar battery in the prescribed area when the battery is of circular disc shape and hence the module charging density when forming the module with the solar battery produced with the wafer product so as to improve the charging density with the solar battery of desired square shape. According to the inventive concept there is also eliminated the defect of cutting off the depending edge from the outer peripheral edge of the wafer product by coating a moisture preventive agent of boron nitride or the like on the outside surface next to the wafer forming surface as described.

The invention also provides a method of fabricating a polycrystalline silicon wafer which can effectively eliminate the defect of cutting off the depending edge from the outer peripheral edge of the wafer product by exhausting the molten liquid of silicon base material excessively supplied from the wafer to the excessively supplied silicon exhausting surface formed by boron nitride on the outside of the wafer forming surface when obtaining the wafer product of desired shape by discharging the excessively supplied liquid by means of the centrifugal force from the wafer forming surface, and forming the thin molten liquid layer over the entire surface of the wafer forming surface with the supplied molten liquid as well as cooling and solidifying the liquid.

By the method herein described it is possible to provide a polycrystalline silicon wafer without pinholes which have occurred in the wafer product and irregular thickness of the wafer due to the uneven surface thereof by forming the thin molten liquid layer on the wafer forming surface in the first step repeatedly, supplying the molten liquid of silicon base material onto the wafer when cooling and solidifying the molten liquid to obtain the substrate wafer, radially flowing the molten liquid by means of the centrifugal force produced by the rotation of the turntable mechanism, and carrying out more than once the step of forming the increased thickness wafer by depositing and solidifying the molten liquid on the substrate wafer.

The invention also contemplates providing an apparatus for fabricating a polycrystalline silicon wafer by radially flowing the molten liquid of silicon base material on the wafer forming surface of a turntable mechanism in a desired atmosphere by means of the centrifugal force produced by the rotation of the mechanism to form the thin molten liquid layer of desired size with the molten liquid, cooling and solidifying the liquid, which apparatus can eliminate the defect of damaging various units installed in the vicinity of the outside due to the adhering of the scattered molten silicon liquid without wasting the silicon base material by arranging a recovery tray for receiving the excessive molten liquid scattered from the wafer forming surface at the outer peripheral side of the wafer forming surface.

Still another object of the invention is to provide an apparatus for fabricating a polycrystalline silicon wafer which can suitably rapidly cool and solidify the molten liquid layer on the wafer forming surface and can improve the productivity by construction to make it possible to cool the wafer forming surface with coolant or refrigerant, e.g., inert gas or the like flowing in a member forming the wafer forming surface.

The foregoing and other related objects and features of the invention will be apparent from a reading of the following description of the disclosure and the accompanying drawings and the novelty thereof pointed out in the appended claims.

BRIEF DESCRIPTION OF THE DRAWINGS

FIGS. 3(a) and 3(b) are explanatory front views of the apparatus of the invention, wherein FIG. 3(a) shows the fabrication preparation state, and FIG. 3(b) shows the final fabrication state;

FIG. 4 is an explanatory front view of still another preferred embodiment of the apparatus according to the present invention;

FIG. 5 is an explanatory front view of modified example of the apparatus shown in FIG. 4;

FIG. 6 is an explanatory front longitudinally sectional view of the turntable mechanism used in the apparatus of the invention;

FIG. 7 is an explanatory front view of still another preferred embodiment of the apparatus of the invention used for carrying out the method of fabricating the wafer;

FIGS. 8(a) and 8(b) are explanatory plan views of the wafer tray of the apparatus in various modified forms;

FIG. 9 is an explanatory front longitudinally sectional view of another modified example of the turntable mechanism used in the apparatus of the invention;

FIG. 10 is an explanatory front view of the apparatus for carrying out the method of the invention;

FIG. 11 is an explanatory front longitudinally sectional view of still another modified example of the turntable mechanism of the apparatus of the invention;

DESCRIPTION OF THE PREFERRED EMBODIMENTS

Figure 1:
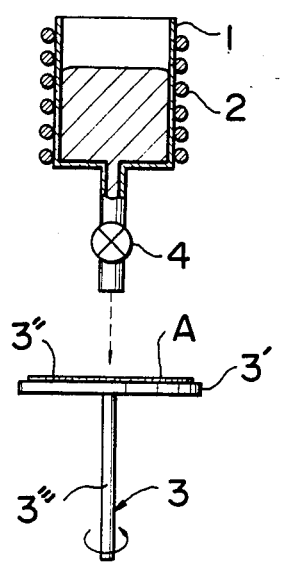
FIG. 1 is an explanatory front view of the apparatus for fabricating a polycrystalline silicon wafer used for carrying out the method of fabricating the silicon wafer according to the present invention.

Reference is now made to the drawings, particularly to FIG. 1, which shows one preferred embodiment of the apparatus for fabricating a polycrystalline silicon wafer for carrying out the method of fabricating the wafer according to the present invention. In FIG. 1, a melting heat source 2, e.g., an electric heater or the like is arranged at the outer peripheral side of a crucible 1. A silicon base material thrown into the crucible 1 is heated by the heat source 2 based upon a temperature of 1,420° C. as the melting point of the silicon, and is thus molten in the crucible 1. The heat source 2 may be, as shown in FIG. 1, an electric heating wire, a high frequency heater, which is preferred which can suitably stop the heating or can control the heating conditions.

The silicon base material may be metallic silicon, semiconductor high purity silicon, etc. The material of the crucible 1 may be quartz, graphite, etc. which is preferably less reactive with the silicon. In the apparatus shown in FIG. 1, a turntable mechanism 3 is arranged directly under the crucible 1. Since a turntable 3' of the mechanism 3 is spaced from the heat source 2 on the surface thereof, it is not thermally affected by the heat source. The turntable 3' may be formed of the same type of material as the crucible 1 due to the reason described with respect to the crucible 1.

A cock 4 is provided at the bottom of the crucible 1. When the silicon base material in the crucible 1 is melted by the heat source 2 to become molten liquid, the molten liquid may be poured substantially to the center of a wafer forming surface 3" of the upper surface of the turntable 3' by opening the cock 4.

The quantity of the molten liquid thus poured may be adjusted by controlling the degree of opening the cock 4. When the molten liquid is poured, it is preferred to rotate the turntable 3' in advance. However, the turntable 3' may be rotated simultaneously upon opening of the cock 4, or may start rotating before the molten liquid is not solidified after the liquid is completely poured. The molten liquid is radially outwardly flowed by means of the centrifugal force of the rotating turntable 3', and a thin molten liquid layer A having a predetermined diameter may be formed.

In the case exemplified in FIG. 1, since the turntable 3' is not heated by the heat source 2, the thin liquid layer A may be solidified by natural cooling, and a polycrystalline silicon wafer of thin disc layer can be obtained.

The size of the wafer can be controlled by the rotating speed of the turntable 3'. The rotating speed may be empirically obtained by considering the relationship between the quantity of the molten liquid and the thickness of the wafer. The rotating speed of the turntable to obtain a desired ordinary wafer may be relatively slow speed, e.g., 100 to 1,000 rpm. The size of the turntable 3' should be larger than the diameter of the wafer to be obtained.

Figure 2:
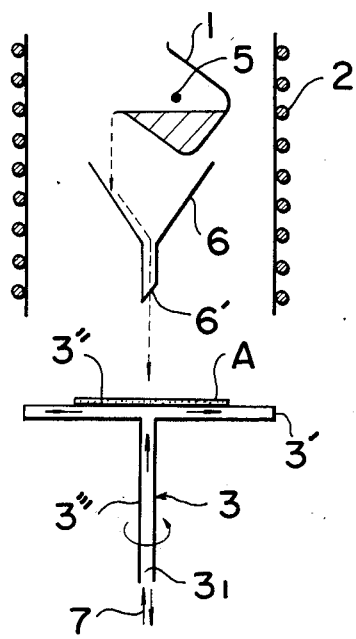
FIG. 2 is an explanatory front view of another preferred embodiment of the apparatus according to the present invention.

In the apparatus shown in FIG. 2, a cock is not provided at the crucible 1. The crucible 1 is rotated around the center of rotation 5 as an axis of rotation, and the molten liquid of silicon base material can be discharged from the opening of the crucible 1. A funnel 6, arranged directly under the crucible 1, is formed of the same material as the crucible 1, and is arranged under the heating condition by the heat source 2. The turntable 3' arranged directly under the funnel is disposed relatively in the vicinity to be heated by the heat source 2.

The molten silicon liquid thus discharged from the crucible 1 due to the rotation of the crucible 1 is temporarily received by and is flowed down to the funnel 6, is further flowed down from the outlet 6' of the funnel 6 onto the upper surface of the turntable 3'. Thus, this molten liquid layer A can be obtained by the centrifugal force produced by the rotation of the turntable 3' in the same manner as the apparatus shown in FIG. 1.

In order to solidify the thin molten liquid layer A, it may be allowed to stand by natural cooling as in the previous embodiment. When the layer A has the desired diameter in this case, the heat source 2 is deenergized. However, the molten liquid remains heated in the crucible 1 while the heat source 2 is energized, and the turntable 3' may then be cooled to solidify the layer A.

The forcible cooling means used in this apparatus may be, as shown in FIG. 2, so constructed that the turntable 3' is formed in a cavity including the rotating shaft 3''' and water, inert gas, e.g., He, Ar, or the like is supplied as a coolant 7 from the opening end $3_1$ of the shaft 3''' formed in a pipe shape.

It is preferred to lower the cooling temperature so as to decrease within approx. 200° C. from the melting point of the silicon. In this case, the cooling temperature may be maintained constantly, or may be the melting temperature at the time of pouring the molten liquid silicon and may be thereafter controlled to pour at a rate of approx. 10° C. per minute. In any of the cases shown in FIGS. 1 and 2, when the thin molten liquid layer A reaches a predetermined diameter, the rotation of the turntable mechanism 3 is stopped, or is not stopped, but the rotating speed of the mechanism 3 is decelerated to impart the condition that the diameter of the layer may be increased. The rotation of the turntable may be maintained in this case if the diameter is not increased while forcibly cooling the layer in a suitable manner.

Figure 3A:
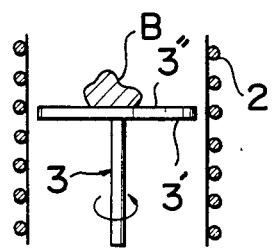
Figure 3B:
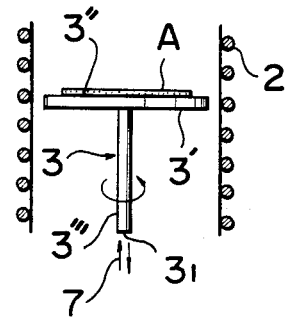

In the apparatus shown in FIGS. 3(a) and 3(b), a turntable 3' is merely disposed under the heating condition by the heat source 2. Silicon base material B is placed in advance in the predetermined quantity, as shown in FIG. 3(a) substantially at the center on the wafer forming surface 3'' of the turntable 3'.

In this embodiment, semiconductor high purity silicon is preferably used for the silicon base material B. When a wafer having an area of 45 cm$^2$ and a thickness of 0.5 mm is desirably obtained, the quantity of the material is approx. 5.0 g. When the heat source 2 is energized, the silicon base material B is molten. The turntable 3 may be rotated at a low speed of the degree that the silicon base material B may not drop from the turntable 3' in the step of melting the material B.

When the silicon base material B is thus molten, the turntable 3' not rotated until then is rotated at the predetermined rotating speed. When the turntable 3' is rotated until then, it may be accelerated in rotation as required. Thus, the molten liquid of the silicon base material is flowed radially outwards by means of the centrifugal force in the same manner as the previous embodiment, and a thin molten liquid layer A can be thus obtained.

The thin molten liquid layer A may be solidified by natural cooling when the heat source 2 is deenergized or by forcibly cooling with the cooling means as described with reference to FIG. 2.

Several embodiments of the apparatus for fabricating the polycrystalline silicon wafer according to the present invention have been described in detail. In these embodiments, these devices may be contained within a chamber (not shown), which may be evacuated in vacuum, or in which an inert gas, e.g., He, Ar, etc. may be introduced as an inert gas atmosphere as required. It can prevent the mixture of an impurity from the exterior or environment into the container under such conditions.

An experimental example of fabricating a polycrystalline silicon wafer will be described in detail. A silicon base material which contained $10^{15}$/cm$^3$ of impurity (boron) was thrown into a crucible made of quartz and graphite, and was heated and melted at approx. 1,450° C. in an argon atmosphere. The molten liquid of the silicon base material thus heated was then dropped in several droplets to the center on the the turntable through a funnel of quartz and graphite. Simultaneously, turntable mechanism was rotated, and when a thin molten liquid layer having approx. 5 cm of diameter and approx. 0.5 mm of thickness was formed in this manner, the turntable was stopped rotating and heating. The turntable was treated by He gas to thus solidify the thin molten liquid layer.

The polycrystalline silicon wafer (P-type, resistivity: 1 to 8 Ωcm) thus obtained was chemically etched by an ordinary method, was mirror-polished on the surface, and was used to fabricate a solar battery hereafter described.

Phosphorus (P) was diffused in the wafer thus fabricated with PH$_3$ (phosphine) in N$_2$ atmosphere at 850° C. by an ordinary method, and an n-type layer of 0.3 μm was formed on the surface. Then, the front and back surface electrodes of TiAg were mounted respectively on the front and back surfaces of the wafer, and a reflection preventive film was covered thereon to thus obtain a final wafer product.

A light of 100 w/cm$^3$ of AMI was irradiated via a solar simulator to a solar battery thus fabricated with the wafer, and then the photoelectric conversion efficiency of 4 to 6% was obtained.

Since the method of fabricating the polycrystalline silicon wafer according to the present invention can eliminate the difficulty of the conventional slice method and ribbon method of an ingot, and is not limited by the respective surfaces of the casting mold as in the conventional casting method but can solidify the silicon base material placed on the turntable, the molten silicon liquid can be contacted only with the wafer forming surface 3'' merely at the lower surface thereof. Accordingly, the molten liquid can be solidified in the free state with respect to the lateral and longitudinal axial directions, and can thus grow in the form of crystalline grains almost without suppressing factor, with the result that larger crystalline grains can be uniformly grown in the interior and at the circumferential part. Since the molten liquid is contacted only with one side surface, there is no problem of cracking at the wafer due to the difference of the thermal expansion at the time of solidifying the wafer.

The apparatus for fabricating the polycrystalline silicon wafer for carrying out the method according to the present invention can be further simplified in construction and can also be reduced in size. Also there is no difficulty in the starting operation, and automation elements can be introduced from the standpoint of mass production, and has accordingly excellent advantages as compared with the conventional casting method.

When the molten silicon liquid is placed on the turntable as described by pouring the molten liquid obtained by melting the silicon base material in advance, it can satisfy the mass production, can facilitate the control of supplying the molten liquid, and a uniform polycrystalline silicon wafer can be effectively obtained.

When the silicon base material is placed in advance on the turntable as means for disposing the molten silicon liquid and is heated and melted by the predetermined heat source, the crucible for melting the silicon becomes unnecessary, thereby reducing the cost, such an apparatus can be conveniently employed not only in an industrial production but in an empirical or trial production, and the time from melting to solidifying the silicon material can be shortened. Accordingly, it is possible to also eliminate the problem of mixing an impurity with the wafer due to the atmospheric condition with good result.

In the apparatus shown in FIGS. 4 and 5, it is different from the apparatus shown in FIGS. 1 and 2 that the turntable 3' of the turntable mechanism 3 is not a merely planar plate, but has a rising peripheral edge 8 on the wafer forming surface 3" at the outer peripheral side, the turntable 3' is telescopically and elevationally movable in the heating space 2' with the melting heat source 2, and further a nozzle N is disposed directly above the center of the turntable mechanism 3.

As shown in FIGS. 3(a) and 3(b), the silicon base material B is placed at the center on the wafer forming surface 3" on the turntable 3', is heated and melted by the heat source 2, and the molten liquid thus obtained is caused to flow radially outwards by means of the centrifugal force produced by the rotation of the mechanism 3 in such a manner that the mechanism is gradually accelerated in rotation so that the molten liquid thus expanded radially outwards reaches the rising peripheral edge 8. In this way, the thin molten liquid layer A of desired shape defined at the peripheral edge 8 can be formed, is then cooled and solidified to thus obtain a wafer product.

In the method thus described, the molten liquid of the silicon material is caused to flow radially outwards not only by the centrifugal force produced by the rotation of the turntable mechanism 3 but also by injecting gas 9 from the nozzle N to the molten liquid, thereby aiding the radial outward flow of the molten liquid.

The molten liquid obtained from the silicon base material is as shown in FIGS. 1 and 2, the crucible, the wafer forming surface 3" of the turntable have already been described. Also, it is preferred to heat the molten silicon material so that it does not solifify.

The means for injecting the gas 9 from the nozzle N to the molten liquid of the silicon base material may be, as shown in FIG. 4, constructed to inject the gas 9 radially outwards, spread in a conical shape from the nozzle N steadily disposed to direct the gas downwardly, or the apparatus may also be constructed, as shown in FIG. 5, not to steadily dispose the nozzle N but to tiltably dispose it obliquely with respect to the axis the nozzle N and to tilt it rockably as illustrated by broken lines with arrows, so as to radially and outwardly inject the gas 9 sprayed from the nozzle N to the molten liquid obliquely with respect to the axis toward the outer peripheral edge side of the wafer forming surface 3".

Thus, the molten liquid of the silicon base material is rapidly flowed toward the rising peripheral edge 8, and the thin molten liquid layer A of predetermined size defined at the outer peripheral edge A' by the peripheral edge 8 with a uniform thickness. The gas 9 thus used may preferably include an inert gas, e.g., agron, helium etc.

When the molten liquid layer A is thus obtained, it is then cooled and solidified in the same manner as described with respect to the previous embodiment of the apparatus of the invention. The cooling means may be constructed to lower the turntable mechanism 3 and to thus move the turntable 3' out of the heating space 2'. In this case, the turntable 3' may be lowered after the thin molten liquid layer A is obtained, or the molten liquid layer A may be formed while precedingly lowering the turntable 3'. Or, the molten liquid layer A may be cooled while the turntable 3' is steadily mounted by deenergizing the heat source 2. In order to complete the solidification of the molten liquid layer A in a short time, it is preferred to supply coolant 7, e.g., water, inert gas or the like as described with reference to FIG. 2 while lowering the turntable 3'.

FIG. 6 shows in detail the flowing mechanism of the coolant 7. In FIG. 6, the coolant 7 is flowed upwardly through a feed pipe 10 inserted into a pipe of the rotating shaft 3''', and is then passed through a forward passage formed by the partition wall formed in the turntable 3', it is further passed via a folded port 12 of the rising peripheral wall 8 through a backward passage 13, and is thereafter exhausted through an annular passage 14 of the outer periphery of the rotating shaft 3''', from the opening end $3_1$.

According to the method of fabricating the polycrystalline silicon wafer with the gas injection means of this embodiment of the invention, the molten liquid of the silicon base material can be forcibly flowed at an extremely high speed by injecting the gas from the nozzle, and thus the productivity of the method can be greatly improved, the opportunity of mixing an impurity with the molten liquid can be abruptly shortened, and the wafer of a predetermined size can be simply obtained by the rising peripheral edge of the wafer forming surface at the outer peripheral side. When the wafer forming surface of the turntable is retained horizontally, the wafer of uniform thickness can readily be obtained from the thin molten liquid layer thus formed from the molten liquid of the silicon base material which has flowed to the rising peripheral edge of the wafer forming surface. In addition, when the molten liquid layer is solidified, it can eliminate, since the upper surface of the thin molten liquid layer is opened to the atmosphere, the difficulties of the conventional ingot slicing method and ribbon method, and yet can eliminate the restriction by the respective inner surfaces of the casting mold of the conventional casting method. Accordingly, since the molten liquid of the silicon base material can be solidified in the free state with respect to the longitudinally axial direction and there is no particular detrimental factor of growing the crystalline grains, large crystalline grains can be grown relatively uniformly, and the wafer of good conversion efficiency can be obtained.

Still another preferred embodiment of the method of fabricating the polycrystalline silicon wafer executed by the apparatus shown in FIGS. 7 and 9 will be described. In this embodiment of the apparatus, the construction of the crucible 1, the melting heat source 2, the center 5 of rotation, the funnel 6 and the outlet 6' are constructed in the same manner as that shown and described with respect to FIG. 2, but it is different from the apparatus shown in FIG. 2 in that the forming member of the wafer forming surface 3" of the turntable mechanism 3 is not the turntable 3'.

More particularly, the turntable 3' is arranged under the heating condition of the melting heat source 2, and furthermore has a rising peripheral wall 15 at the outer peripheral side, which has the function for recovering the excessive silicon as a recovery tray 16 as will be described in greater detail. A wafer tray 17 is placed at the center on the turntable 3', and is detachable affixed onto the turntable 3', and is formed with the wafer forming surface 3" thereon.

The wafer tray 17 is composed of a rising peripheral edge 8' and a bottom plate having a wafer forming surface 3". The shape of the outer periphery of the peripheral edge 8' may be not only circular, but also polygonal, e.g., square as shown in FIG. 7, or other shape. The recovery tray 16 of the turntable 3' is so constructed that the rising peripheral wall 15 is higher than the rising peripheral edge 8' of the wafer tray 17.

In the method of this embodiment of the invention, the molten liquid of the silicon base material is poured to the substantially center of the wafer tray 17 from the outlet 6' of the funnel 6 in the same manner as described with reference to FIG. 2, and the molten liquid flows radially outwards by means of the centrifugal force produced by the rotation of the turntable 3' and hence the wafer tray 17 via the turntable mechanism 3 in the same manner as described previously.

The quantity of supplied molten liquid to be poured in the this embodiment of the invention is hereafter explained. As shown in FIGS. 8(a) and 8(b), when the rising peripheral edge 8" of the wafer tray 17 is formed square or hexagonal, the molten liquid of the quantity equal to or more than volume of the cylindrical space having the length from the center O to the farthest inner positions O', O" and hence the maximum inner diameter 2 r and the depth h of the rising peripheral edge is supplied. Thus, the wafer tray 17 is filled with the molten liquid thus radially outwardly flowed, and the excessive molten liquid is exhausted or overflowed outwardly from the upper edge of the wafer tray 17. The molten liquid thus exhausted is dropped and solidified in the recovery tray 16 in the case of this embodiment, and accordingly it can eliminate the wasteful consumption of the silicon base material and the exhausted molten liquid of the silicon base material can be reused in this manner.

Since the thin molten liquid layer A can be formed of the molten liquid filled in the wafer tray 17 as described, it can be solidified by natural cooling or by the forcibly cooling means of adequate means for the wafer tray 17, and the polycrystalline silicon wafer of the product can be thus obtained advantageously.

The experimental example of fabricating the polycrystalline silicon wafer will now be described. A wafer tray 17 made of quartz and formed in a square shape of 5 mm thick with a rising peripheral edge 8' formed in a square shape of 50 mm on one side was employed. The recover tray 16 had 100 mm of inner diameter and 20 mm of depth made of quartz. Approx. 50 g of silicon base material was placed into the crucible 1, and was then heated at 1,450° C. therein, and the molten liquid of the silicon base material was then poured through the funnel 6 to the center on the wafer tray 17 rotating at a predetermined constant speed. Thus, the wafer of the same shape as the interior of the wafer tray 17 could be thus obtained, and the silicon exhausted to the recovery tray 16 was then recovered.

According to the method of this embodiment of the invention, when the space defined by the wafer forming surface 3" and the rising peripheral edgve 8' is set at the desired dimensions using the wafer tray 17 and the like, the wafer of the desired shape, e.g., polygonal shape and the like can be readily obtained. It is preferred even in this case in the same manner as described with respect to the previous embodiment to contain the molten metal in the apparatus in a chamber (not shown) and to evacuate the chamber in vacuum or to fill inert gas atmosphere therein.

Still another preferred embodiment of the method of fabricating the polycrystalline silicon wafer according to this invention will be described with reference to FIGS. 10 through 13. The apparatus shown in FIG. 10 has the same members as those shown in FIG. 7, but is constructed differently from that shown in FIG. 7. The wafer forming surface 3" is not provided by the wafer tray 17 but is formed as the ceiling of the wafer tray 17'. The wafer tray 17' is placed at the center of axis of the turntable 3' in the same manner as shown in FIG. 7', and the recovery tray 16 is formed by the turntable 3'.

Figure 12:
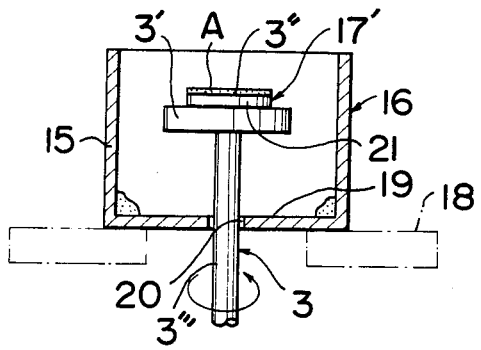
FIG. 12 is an explanatory front longitudinally sectional view of still another modified example of the turntable mechanism of the invention.
Figure 13:
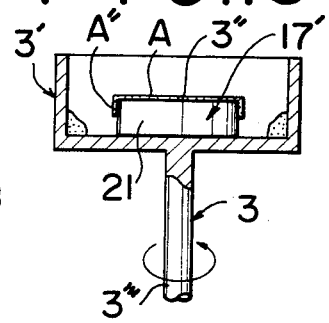
FIG. 13 is an explanatory front longitudinally sectional view of the turntable mechanism shown in FIG. 10 in the case that a defective wafer is fabricated.

In the apparatus shown in FIG. 12, the turntable 3' fixedly secured to the upper end of the rotating shaft 3''' is merely a planar plate, and the wafer tray 17' is placed at the center of the axis of the plate 3'. In this case, the recovery tray 16 is advantageously separated from the turntable 3'. In this embodiment, an axial hole 20 is perforated at the bottom 19 of the recovery tray 16 provided at the desired fastening position 18, and the rotating shaft 3''' is movably passed therethrough.

The molten liquid of the silicon base material is thus poured from the outlet 6' of the funnel 6 substantially to the center of the wafer forming surface 3" of the ceiling of the wafer tray 17' in the same manner as was described with reference to FIG. 7 using the apparatus described, and is flowed radially outwards by means of the centrifugal force produced by the rotation of the turntable mechanism at the proper time in the same manner.

The wafer tray 17 may have the wafer forming surface 3" of desired shape, e.g., circular, square, etc. of various dimensions, any of which can be arbitrarily selected. When the quantity of the molten liquid is sufficiently supplied, the molten liquid of the silicon base material thus flowed radially outwards is spread over the entire surface of the wafer forming surface 3", is thus extended to the outer peripheral edge, and the excessive molten liquid is discharged from the outer peripheral edge by the centrifugal force produced, with the result that the thin molten liquid layer A which matches the shape of the wafer forming surface 3" is thus formed, and is solidified by natural cooling or by adequate cooling means, thereby producing the wafer of the desired product. In the apparatus thus described, the molten silicon liquid thus scattered and discharged from the outer peripheral edge can be reused by cooling and solidifying it with the recovery tray 16 in the same manner as was described previously.

The experimental example of fabricating the polycrystalline silicon wafer will now be described. The wafer tray 17' made of graphite having a thickness of 5 mm was employed. The recovery tray 16 had 180 mm of inner diameter and 20 mm of depth made of quartz. The wafer tray 17' was heated at 800° C. to 1,300° C. in the apparatus of FIG. 11. The turntable mechanism 3 was rotated at 100 to 500 r.p.m., the silicon base material in the crucible 1 made of quartz was molten at 1,455° C. the liquid thus molten was then supplied onto the wafer forming surface 3', and wafers of various products having 50 mm·50 mm, and 70 mm, 100 mm of diameter were obtained.

When the method thus described was carried out, a moisture preventive agent 22, e.g., boron nitride or the like is coated in advance as shown in FIG. 11 on the outside surface 21 continuously depending perpendicularly from the wafer forming surface 3" of the ceiling of the wafer tray 17'.

That is, when the method of fabricating the polycrystalline silicon wafer of the invention is carried out, in case various conditions such as, the quantity of supplied molten silicon liquid, the thickness of the wafer of the product thus obtained, and other mechanical factors are improper, the molten liquid discharged from the wafer forming surface 3" might not scatter to the recovery tray 16, but might flow down to the outside surface 21 of the wafer tray 17'. In this case, the wafer of the product thus obtained is formed not in a planar shape, but is formed with a dish shape having depending edge A" solidified integrally with the planar part. This depending edge A" should be cut off from the wafer of the product thus formed.

Since the step of coating the moisture preventive agent, e.g., boron nitride or the like on the outside surface 21 is added to the method described, the molten liquid of the silicon base material which has thus crept to the outside surface 21 of the wafer tray 17' is repelled by the boron nitride thus coated and is not thus integrated with the molten liquid on the wafer forming surface 3", and is all recovered as excessive molten silicon liquid by the recovery tray 16.

The wafer of various dimensions and shapes can be fabricated without strict controls for the rotating speed of the turntable mechanism 3, the temperature of the wafer forming surface 3", the height of the funnel 1, etc. in this manner. When the apparatus thus described with the recovery tray 16 for receiving the excessive molten liquid scattered from the wafer forming surface 3" at the outer peripheral side of the wafer forming surface 3" is employed as shown in FIGS. 11 and 12, it can eliminate the wasteful loss of the silicon base material and various defects caused by scattered molten liquid of the silicon base material.

Still another method of fabricating the polycrystalline silicon wafer will be further described with reference to the apparatus shown in FIGS. 14 and 16. In the apparatus shown, the turntable mechanism 3 as shown is employed, and the other members are built in the same manner as those shown in FIGS. 7 and 10.

Figure 14:
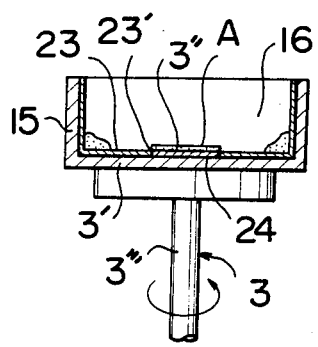
FIG. 14 is an explanatory front longitudinally sectional view of the turntable mechanism in the apparatus for carrying out the method of the invention.

In FIG. 14, a turntable 3' is fixedly secured onto the upper end of the rotating shaft 3'" in the turntable mechanism 3, the rising peripheral wall 15 is formed from the outer peripheral side of the turntable 3' in the same manner as shown in FIGS. 4 and 5, an excessive silicon discharging surface 23 is formed by coating boron nitride on the outer periphery on the upper surface of the turntable 3', and the wafer forming surface 3" is so formed on the upper surface of the turntable 3' with the inside edge 23' of the discharging surface 23 as to be coaxial with the center of rotation of the turntable mechanism 3.

Figure 15:
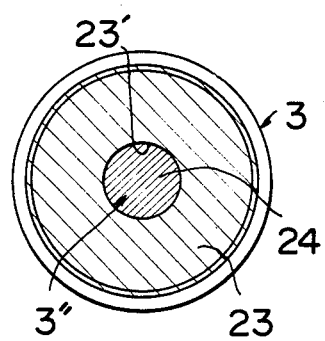
FIG. 15 is a plan view of the mechanism in FIG. 14.

The wafer forming surface 3" may be shaped by the inside edge 23' to become circular, square, or other desired form depending upon the shape of the wafer to be obtained. In the embodiment of FIGS. 14 and 15, the wafer forming surface 3" does not employ the upper surface of the turntable 3' as it is, but a mold releasing agent 24, e.g., silicon nitride or the like is coated on the upper surface of the turntable 3', and the surface of the agent 24 is used as the wafer forming surface 3". In this case, it is preferred to dispose the excessive silicon discharging surface 23 in the same height as the wafer forming surface 3", but the wafer forming surface 3" may be lower than the excessive silicon discharging surface 23. Further, in the embodiments shown in FIGS. 14 and 15, the boron nitride may be coated not only on the upper surface of the turntable 3' but also on the inside surface of the rising peripheral wall 15, and thus the outer periphery of the turntable 3' is used as the recovery tray 16.

When the wafer is produced as described, the supplied molten liquid of the silicon base material supplied to the wafer forming surface 3" coated with the mold releasing agent 24, is then flowed radially outwardly flowed over the entire surface of the wafer forming surface 3" by means of the centrifugal force produced by the rotation of the turntable mechanism 3, and when it is desired to further flow the molten liquid radially outwards, the molten liquid is flowed into the excessive silicon discharging surface 23. Since the boron nitride is coated on the discharging surface 23 in this case, the discharging surface 23 does not have wettability with all substances and is stable even at high temperature. Accordingly, the molten liquid thus flowed thereto is scattered by the centrifugal force, is in turn solidified on the discharging surface 23. Thus, the silicon material thus scattered can be recovered and reused. In this manner, the thin molten liquid layer A can be formed over the entire surface of the wafer forming surface 3" with the supplied molten liquid of the silicon base material, is then cooled by natural cooling or by forcible cooling means, and is thus solidified, thereby obtaining the wafer product.

Figure 16:
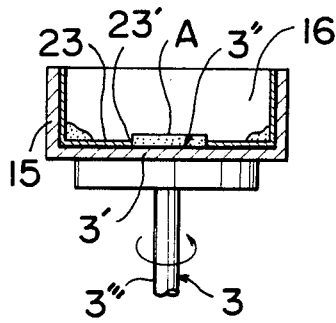
FIG. 16 is an explanatory front longitudinally sectional view of the further modified turntable mechanism of the invention.
Figure 17:
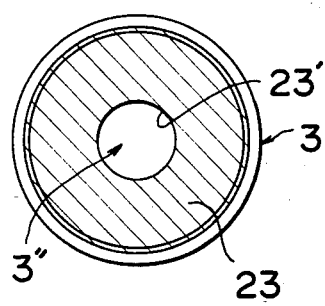
FIG. 17 is an explanatory plan view of the mechanism in FIG. 14.

In FIGS. 16 and 17, the supplied molten liquid of the silicon base material is supplied directly onto the upper surface of the turntable 3'. In this case, the molten liquid is flowed radially outwards over the entire surface of the wafer forming surface 3". The molten liquid placed lower than the excessive silicon discharging surface 23 is prevented from being further flowed radially outwardly by the inside edge 23' as shown in FIG. 14, the molten liquid raised higher than the discharging surface 23 is scattered and discharged, though tending to further radially outwardly flow, via the discharging surface 23 coated with the boron nitride, and the thin molten liquid layer A defined by the inside edge 23' of the discharging surface 23 is eventually formed; it is then cooled and solidified, thereby obtaining the wafer product.

Another example will now be described. The turntable 3' was formed of a quartz tray having 180 mm of inner diameter and 20 mm of depth, the wafer forming surface 3" was so formed on the central part as to match the coating center of the silicon nitride. Boron nitride was coated by spraying or in paste form on the remaining surface, or the silicon nitride was not coated, but the turntable mechanism was rotated at 100 to 500 r.p.m., and was heated under control at 800° C. to 1,300° C., the molten liquid of the silicon base material was supplied thereto, and a square wafer having 50 mm×50 mm or one having 100 mm of diameter in the same shape as the wafer forming surface 3" was fabricated.

Figure 18A:
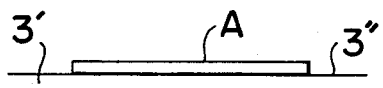
FIGS. 18(a) through 18(d) are explanatory views of the steps of fabricating the wafer according to the present invention.
Figure 18B:
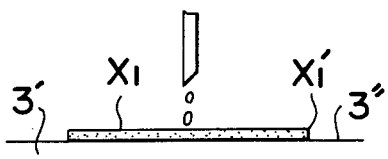

When the wafer is produced by the method described as above, it can eliminate the wafer trays 17 and 17' employed in the previous embodiments. Accordingly, it can also eliminate the fault of the trays 17, 17' causing an unintentional variation during rotation. Since the wafer forming surface of any shape can be simply formed by coating the boron nitride thereon, the wafer of any arbitrary shape, e.g., circular, polygonal, etc. can be simply fabricated, and the excessive wafer can be simply recovered with the scattered silicon base material. When the thin molten liquid layer A is obtained on the wafer forming surface 3" of the turntable 3' as shown in FIG. 18(a) in accordance with the method and apparatus shown in FIGS. 1 and 2, a substrate wafer $X_1$ shown in FIG. 18(b) is formed by cooling and solidifying the layer. Since the thickness of the substrate wafer $X_1$ is, in this case, not controlled by the quantity of the supplied molten liquid, but determined according to various factors, e.g., the temperature of the wafer forming surface 3", the rotating speed of the turntable mechanism 3, and the distance between the wafer forming surface 3" and the outlet 6' of the funnel 6, etc., the substrate wafer $X_1$ is formed under the prescribed conditions of these parameters.

Further, the molten silicon liquid of the prescribed quantity is poured onto the substrate wafer $X_1$ thus obtained at the center under the conditions not so different from the prescribed conditions, and is thus flowed radially outwards by the centrifugal force produced by the rotation of the turntable mechanism 3 on the upper surface of the substrate wafer $X_1$.

The molten liquid of the silicon base material thus supplied melts the upper surface layer of the substrate wafer $X_1$ and causes the lower surface layer of the wafer $X_1$ to be not molten in the course of radially outwardly flowing thereon. In this case, the molten liquid flows into the pinholes occurred on the substrate wafer $X_1$, thus fills the pinholes, and buries the recesses, if any. Further, the molten liquid flows radially outwards while melting the upper surface layer of the wafer $X_1$, and accordingly causes an adhesive force between the molten liquid and the upper surface layer. Thus, the molten liquid radially outwardly flows without flowing outwardly from the outer peripheral edge $X_1'$ of the wafer $X_1$ unless the forming conditions of the substrate wafer $X_1$ are not so extremely different from those of this molten liquid.

Figure 18C:
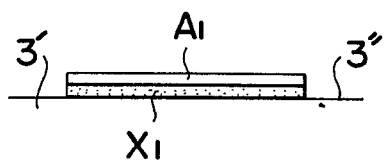
Figure 18D:
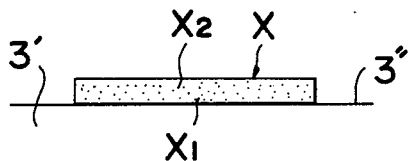

Thus, the molten liquid is spread over the entire surface of the substrate wafer $X_1$, the increased thick molten liquid layer $A_1$ is formed as shown in FIG. 18(c), is then cooled and solidified, the increased thick wafer $X_2$ fusibly bonded and solidified to the substrate wafer $X_1$ can be thus obtained, and the wafer of the product X formed by integrating the substrate wafer $X_1$ with the increased thick wafer $X_2$ can be obtained as shown in FIG. 18(d).

According to the present invention, the molten liquid of the silicon base material is thus supplied in the same manner as described onto the upper surface of the increased thick wafer $X_2$ thus formed, the increased thick wafer part (not shown) may be laminated repeatedly in the prescribed required number of times, and may be laminated at least once with the step of forming the increased thick wafer part as described above.

Another example will now be described. A turntable 3' made of quartz having 80 mm of inner diameter and 4 mm of depth was employed. The turntable was maintained at high temperature constantly, was then turned by rotating the turntable mechanism 3 at 50–5000 r.p.m., approx. 50 g of silicon base material B was thrown into the crucible 1 made of quartz, was heated at 1,450° C., and was thus molten, and the molten liquid was then flowed down to the center of the turntable 3' through the funnel 6 of quartz as described first in the quantity of approx. 25 g., the thin molten liquid layer $A_1$ was then solidified after several seconds to several minutes, and the substrate wafer $X_1$ was thus obtained. The thickness of the wafer $X_1$ was approx. 0.2 mm.

Then, the molten liquid of the remaining 25 g was supplied to the center on the upper surface of the substrate wafer $X_1$ in the same manner as above, the increased thick wafer part $X_2$ was thus formed thereon, and the thickness of the wafer was 0.4 to 0.5 mm.

It is appreciated from the foregoing description that since the method of fabricating the polycrystalline silicon wafer according to the present invention does not produce the wafer by only one supply of the molten liquid of the silicon base material, but obtains the wafer by supplying more than twice the molten liquid, the pinholes and recesses existing on the increased thick wafer part $X_2$ can be corrected when the substrate wafer $X_1$ is formed by supplying the molten liquid of the silicon base material more than three times onto the substrate wafer $X_1$, with the result that there are no pinholes or recesses on the final wafer thus formed, or an extremely small number of the pinholes and recesses exist on the wafer thus formed. Thus, the polycrystalline silicon wafer for use as a semiconductor wafer for producing a solar battery or the like can be fabricated.

What is claimed is:

1. In a method of fabricating a polycrystaline silicon wafer, comprising the steps of:
   (a) placing molten silicon in a dispensing zone located over a centrifugal zone having a defined rising outer peripheral wall (15) which encloses said zone;
   (b) pouring molten silicon in a predetermined measured quantity at about the center of said centrifugal zone; and,
   (c) cooling the silicon layer which is over the surface of said centrifugal zone; the improvement in said method consisting of the additional steps of:
   (d) disposing a turntable (3') in said centrifugal zone under said dispensing zone, said turntable (3') having said rising peripheral wall (15) at about the outer peripheral edge;
   (e) attaching a wafer tray (17) onto the turntable (3'), said wafer tray (17) having a rising peripheral edge (8'), the zone peripheral wall (15) being higher than said peripheral edge (8'), said wafer tray (17) being somewhat smaller than the centrifugal zone, and having a bottom plate with a wafer-forming surface (3″), the space between the tray peripheral edge (8′) and said zone peripheral wall (15) defining a recovery zone (16), so that said molten silicon liquid from said dispensing zone is poured substantially onto the center of said wafer tray (17); and, (f) radially outwardly flowing the molten silicon liquid by centrifugal force created by the rotation of the turntable (3′) and hence the wafer tray (17), so that excess molten liquid overflows the tray peripheral edge (8′) and falls and solidifies in the recovery zone so that silicon base material can be recovered and reused.

* * * * *